United States Patent
Combe et al.

(10) Patent No.: US 9,209,380 B2
(45) Date of Patent: Dec. 8, 2015

(54) ACOUSTIC WAVE DEVICE

(71) Applicant: TriQuint Semiconductor, Inc., Hillsboro, OR (US)

(72) Inventors: Suzanne Combe, Longwood, FL (US); Kurt Steiner, Orlando, FL (US); Alan S. Chen, Windermere, FL (US); Charles E. Carpenter, Orlando, FL (US); Ian Yee, Austin, TX (US); Jean Briot, Apopka, FL (US); George Grama, Orcutt, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 279 days.

(21) Appl. No.: 13/791,600

(22) Filed: Mar. 8, 2013

(65) Prior Publication Data

US 2014/0252916 A1  Sep. 11, 2014

(51) Int. Cl.
*H03H 9/25* (2006.01)
*H01L 41/047* (2006.01)
*H03H 3/08* (2006.01)
*H03H 9/10* (2006.01)
*H03H 9/05* (2006.01)

(52) U.S. Cl.
CPC .............. *H01L 41/047* (2013.01); *H03H 3/08* (2013.01); *H03H 9/1071* (2013.01); *H03H 9/0547* (2013.01)

(58) Field of Classification Search
USPC ....... 310/313 R, 313 A–313 D, 348, 365, 366
See application file for complete search history.

(56) References Cited

U.S. PATENT DOCUMENTS

| | | | |
|---|---|---|---|
| 8,461,940 B2* | 6/2013 | Takada et al. | 333/186 |
| 2009/0096321 A1* | 4/2009 | Aikawa et al. | 310/313 R |
| 2011/0234055 A1* | 9/2011 | Fukano et al. | 310/365 |
| 2012/0280768 A1* | 11/2012 | Nakayama et al. | 333/193 |
| 2014/0003017 A1* | 1/2014 | Kai et al. | 361/783 |

OTHER PUBLICATIONS

Fukano; "Wafer-Level Packaged SAW Filters with Resistance to Transfer Molding;" Kyocera Corp.; IEEE International Ultrasonics Symposium Proceedings; 2008.

Kuypers; "Imprinted Laminate Wafer-Level Packaging for SAW ID-Tags and SAW Delay Line Sensors;" IEEE Transactions on Ultrasonics, Ferroelectrics, and Frequency Control, vol. 58, No. 2, Feb. 2011.

(Continued)

*Primary Examiner* — Thomas Dougherty
(74) *Attorney, Agent, or Firm* — Withrow & Terranova, P.L.L.C.

(57) ABSTRACT

Embodiments described herein may provide an acoustic wave device, a method of fabricating an acoustic wave device, and a system incorporating an acoustic wave device. The acoustic wave device may include a transducer disposed on a substrate, with a contact coupled with the transducer. The acoustic wave device may further include a wall layer and cap that define an enclosed opening around the transducer. A via may be disposed through the cap and wall layer over the contact, and a top metal may be disposed in the via. The top metal may form a pillar in the via and a pad on the cap above the via. The pillar may provide an electrical connection between the pad and the contact. In some embodiments, the acoustic wave device may be formed as a wafer-level package on a substrate wafer.

9 Claims, 11 Drawing Sheets

(56) References Cited

OTHER PUBLICATIONS

Palacios-Aguilera; "Dry Film Resist Microfluidic Channels on Printed Circuit Board and its Application as Fluidic Interconnection for Nanofluidic Chips: Fabrication Challenges;" The Fifth International Conference on Quantum, Nano and Micro Technologies; 2011.

Sakinada; "A Study of Wafer Level Packaging of SAW Filter for Module Solution;" Fujitsu Media Devices Limited; 2009 IEEE Ultrasonics Symposium; 2009.

Sensor Products Inc.; "High-resolution p;ermanent p;hotoresist laminate TMMF for sealed microfluidic structures in biological applications;" http://www.sensorprod.com/research-articles/white-papers; Aug. 2011.

Yoshimoto; "Miniature Balanced SAW Duplexers using CSP Technology for UMTS and LTE;" Nihon Dempa Kogyo Co., Ltd.; Fourth International Symposium on Acoustic Wave Devices for Future Mobile Communications; Mar. 5, 2010.

Author Unknown, "Epoxy Sheet Encapsulation for Hallow Package," Nagase & Co., Ltd., 9 pages, obtained Oct. 16, 2013.

\* cited by examiner

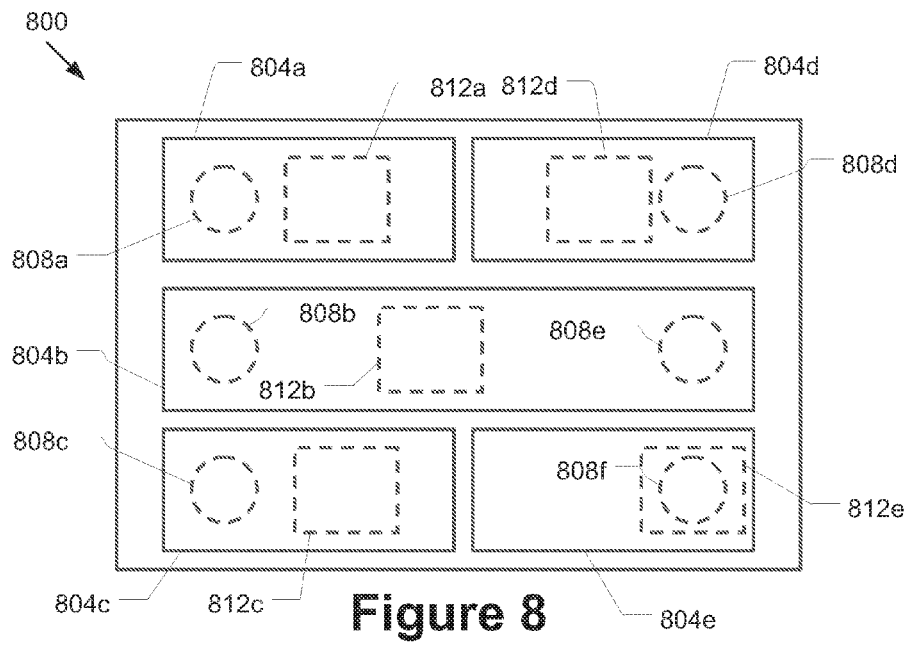
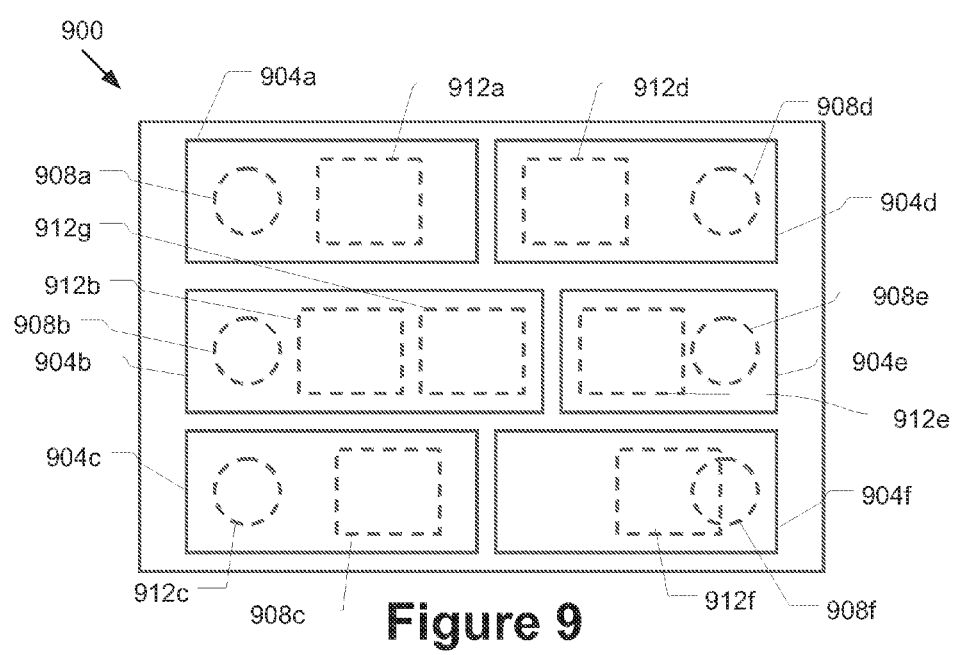

ACOUSTIC WAVE DEVICE

FIELD

Embodiments of the present disclosure generally relate to the field of electronic circuits, and more particularly, to acoustic wave devices.

BACKGROUND

Acoustic wave devices, such as surface acoustic wave (SAW) devices and bulk acoustic wave (BAW) devices are used for many applications, such as radio frequency (RF) filters and sensors. The acoustic wave devices typically include a pair of transducers on a substrate, with pads to provide electrical connections to the transducers. Due to design and manufacturing limitations, the pads are typically placed next to the substrate structure. This requires the substrate to be singulated prior to forming the pads of the acoustic wave device, and also results in a large footprint for the device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 8 schematically illustrates a top cross-section view of an acoustic wave device having a pad coupled with a plurality of pillars, in accordance with various embodiments.

FIG. 9 schematically illustrates a top cross-section view of an acoustic wave device having a pad coupled with a plurality of connectors, in accordance with various embodiments.

DETAILED DESCRIPTION

Embodiments of the present disclosure provide techniques and configurations of an acoustic wave device. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, disposed, or otherwise configured on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

Figure 1:
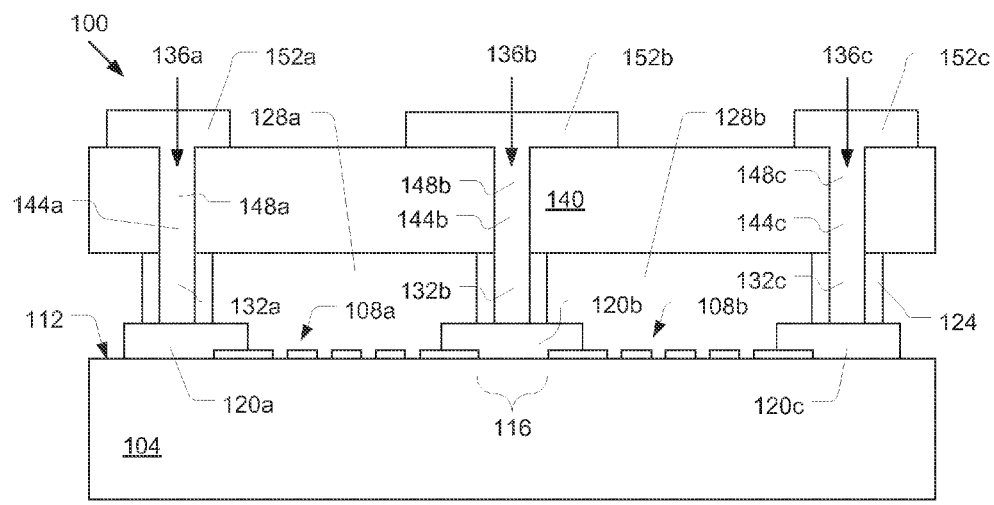
FIG. 1 schematically illustrates a side cross-section view of an acoustic wave device, in accordance with various embodiments.

FIG. 1 schematically illustrates a cross-sectional view of an integrated acoustic wave device 100, according to various embodiments. The acoustic wave device 100 may be, for example, a surface acoustic wave (SAW) device or a bulk acoustic wave (BAW) device. The acoustic wave device 100 may include a piezoelectric substrate 104 with one or more acoustic wave transducers 108a-b disposed on a surface 112 of the substrate 104. In some embodiments, the acoustic wave transducers 108a-b may be interdigitated transducers. The transducers 108a-b may be formed of any suitable material, such as Titanium (Ti) and/or aluminum (Al).

In some embodiments, the acoustic wave transducers 108a-b may include an input transducer 108a and an output transducer 108b separated by a delay line 116. The input transducer 108a may convert an input electrical signal into an acoustic wave (e.g., a surface acoustic wave or a boundary acoustic wave). The acoustic wave may travel over the delay line 116 to the output transducer 104b. The output transducer 104b may convert the acoustic wave to an output electrical signal. Other embodiments may include other quantities or configurations of transducers 108a-b.

In some embodiments, the acoustic wave device 100 may form a radio frequency filter to receive an electrical input signal and produce a filtered electrical output signal based on the input signal. In other embodiments, the acoustic wave device 100 may be another type of acoustic wave device, such as an acoustic wave sensor.

In various embodiments, the acoustic wave device 100 may further include contacts 120a, 120b, and 120c coupled to one or more of the transducers 108a-b. The contacts 120a-c may facilitate electrical connections with the transducers 108a-b and/or provide structural support for the layers of acoustic wave device 100 (e.g., so that the other layers are not directly coupled to the transducers 108a-b). The contacts 120a-c may be formed from an under-bump metal.

The contacts 120a-c may have any suitable configuration in the acoustic wave device 100. For example, the contact 120a may be an input contact coupled to the input transducer 108a, the contact 120c may be an output contact coupled to the output transducer 108b, and/or the contact 120b may be a ground contact coupled to both the input and output transducers 108a-b. Other embodiments may include more or less contacts than those shown in FIG. 1. Additionally, or alternatively, other embodiments may include a different configuration or arrangement of contacts from that shown in FIG. 1. Furthermore, FIG. 1 shows a cross-sectional view of the acoustic wave device 100, and, in some embodiments, the acoustic wave device 100 may include additional contacts (not shown) that may be located in different cross-sections of the device 100.

In various embodiments, the acoustic wave device 100 may further include a wall layer 124 that is disposed on the first surface 112 around the transducers 108a-b and defining openings 128a-b over the individual transducers 108a-b. Although not shown in the cross-sectional view of FIG. 1, the wall layer 124 may encircle the transducers 108a-b. The wall layer 124 may further include holes 132a-c over the respective contacts 120a-c, which may form a portion of vias 136a-c.

In various embodiments, the acoustic wave device 100 may further include a cap 140 on the wall layer 124. The cap 140 may enclose the openings 128a-b over the transducers 108a-b. The cap 140 may further include holes 144a-c over the holes 132a-c of the wall layer 124. The holes 144a-c and 132a-c may combine to form vias 136a-c.

In various embodiments, the acoustic wave device 100 may further include pillars 148a-c disposed in respective vias 136a-c. The pillars 148a-c may be electrically coupled with respective pads 152a-c on the cap 140. The pillars 148a-c may provide electrical connections between the pads 152a-c and the respective contacts 120a-c. The pillars 148a-c may be formed of a top metal.

In various embodiments, the cap 140 and/or wall layer 124 may be formed of a photo-definable dry film material, such as a photo-definable dry film epoxy. This may allow the cap 140 and wall layer 124 to form the enclosed openings 128a-b over transducers 108a-b, as shown. Additionally, or alternatively, forming the cap 140 and wall layer 124 of a dry film epoxy may facilitate formation of the pads 152a-c on the cap 140 and/or pillars 148a-c through the wall cap 140 and wall layer 124 to provide electrical connections to the contacts 120a-c.

In some embodiments, the photo-definable dry film material used to form the cap 140 and/or wall layer 124 may have a glass transition temperature of at least 160 degrees Celsius. This may allow the cap 140 and/or wall layer 124 to maintain the enclosed openings 128a-b during and/or subsequent to processing at high temperatures (e.g., up to the glass transition temperature). Furthermore, the photo-definable dry film material may be configured to maintain the structural integrity of the enclosed openings 128a-b when subjected to high pressure (e.g., greater than 1 MegaPascal).

In various embodiments, the acoustic wave device 100 may be a wafer-level package formed on a wafer of the substrate 104. A plurality of acoustic wave devices, including the acoustic wave device 100, may be formed on the wafer. The wafer may then be diced to separate the acoustic wave devices.

Figure 2:
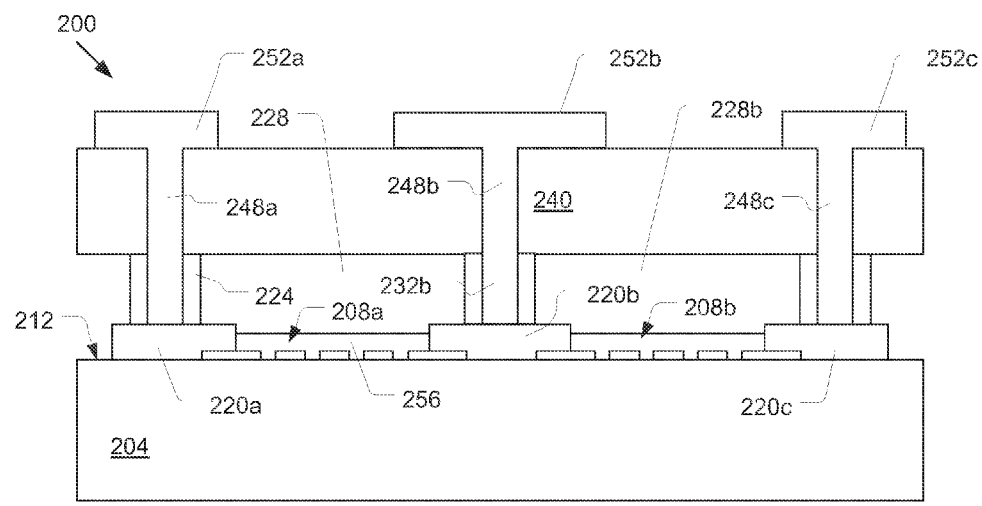
FIG. 2 schematically illustrates a side cross-section view of another acoustic wave device, in accordance with various embodiments.

FIG. 2 illustrates a temperature-compensated acoustic wave device 200 in accordance with various embodiments. The temperature-compensated acoustic wave device 200 may include similar features to acoustic wave device 100. For example, the temperature-compensated acoustic wave device 200 may include a substrate 204 with a stack of layers disposed on a surface 212 of the substrate 204, including transducers 208a-b, contacts 220a-c, a wall layer 224, a cap 240, pillars 248a-c, and pads 252a-c.

In various embodiments, the temperature-compensated acoustic wave device 200 may further include an overcoat oxide 256 disposed over the transducers 208a-b (e.g., between contacts 220a and 220b and between contacts 220b and 220c). The overcoat oxide 256 may facilitate operation of the acoustic wave device 200 over a range of temperatures.

In some embodiments, the temperature-compensated acoustic wave device may include a planarizing oxide (not shown) disposed under the overcoat oxide 256. In some embodiments, the planarizing oxide may be polished (e.g., by chemi-mechanical polishing) prior to depositing the overcoat oxide over the planarizing oxide.

Figure 3:
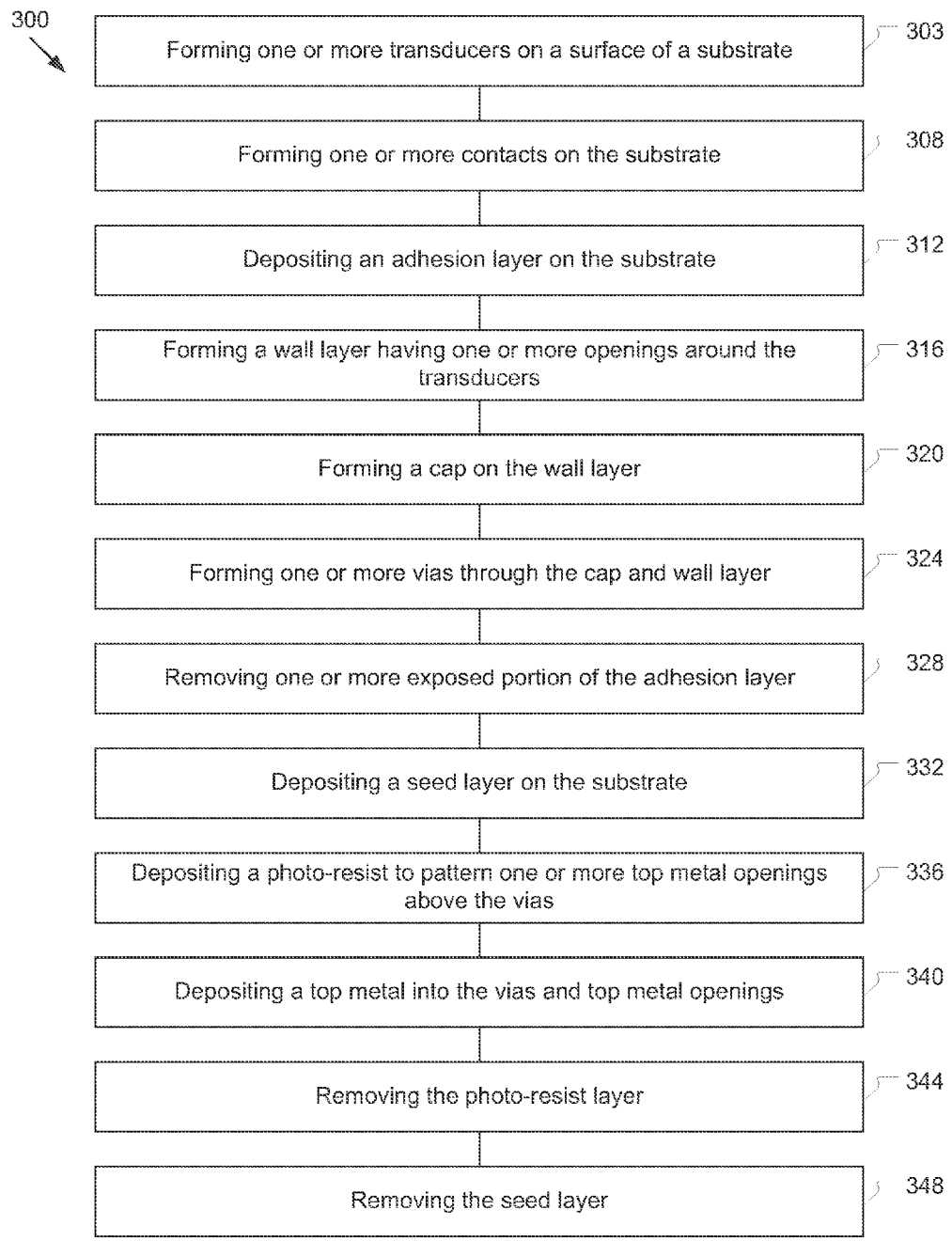
FIG. 3 is a flow diagram of a method for fabricating an acoustic wave device, in accordance with various embodiments.

FIG. 3 illustrates a method 300 of forming an acoustic wave device in accordance with various embodiments. The method 300 is described with reference to an example acoustic wave device 400, which is shown in FIGS. 4A-4L after various operations of the method 300. However, it will be appreciated that the method 300 may be modified to form any of the acoustic wave devices described herein.

Furthermore, various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

At block 304, the method 300 may include forming one or more transducers on a surface of a piezoelectric substrate. The transducers may be formed, for example, by patterning a base metal on the surface of the substrate. The base metal may include any suitable material, such as Titanium and/or Aluminum. The base metal may be patterned by any suitable method, such as plasma etch or liftoff. The transducers may be, for example, interdigitated transducers. In some embodiments, a pair of transducers (e.g., input and output transducers) may be formed on the substrate and may be separated by a delay line.

Figure 4A:
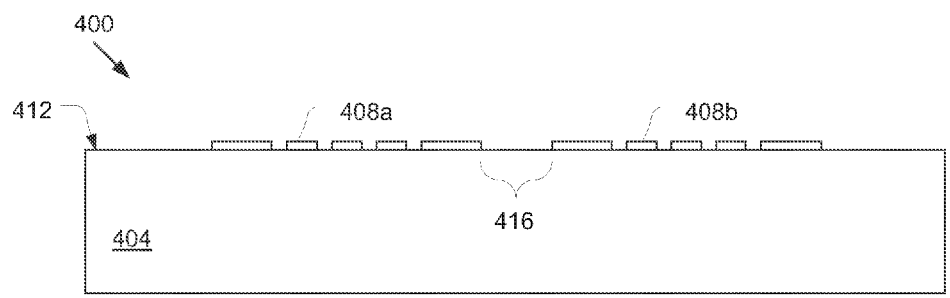
FIGS. 4A-4L schematically illustrate an acoustic wave device subsequent to various operations of the method of FIG. 3, in accordance with various embodiments.

FIG. 4A shows an example acoustic wave device 400 subsequent to the operation of block 304 in accordance with some embodiments. The acoustic wave device 400 may include a piezoelectric substrate 404 with transducers 408a and 408b formed on a surface 412 of the substrate 404. In some embodiments, the transducers 408a-b may be interdigitated transducers separated by a delay line 416.

At block 308, the method 300 may include forming one or more contacts on the substrate. The contacts may be formed, for example, by patterning an under-bump metal on the substrate. The under-bump metal may include any suitable material, such as Titanium and/or Aluminum. The under-bump metal may be patterned, for example, by liftoff. The contacts may be electrically coupled with one or more of the transducers.

Figure 4B:
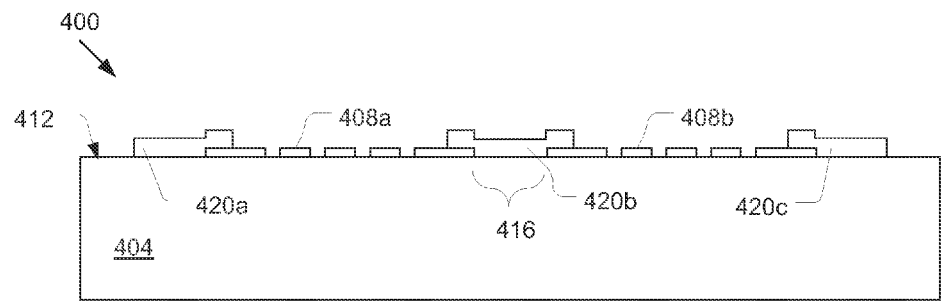

FIG. 4B shows the example acoustic wave device 400 subsequent to forming contacts 420a-c on the substrate 404 in accordance with some embodiments of block 308. The contact 420a may be coupled with transducer 408a, contact 420b may be coupled with and between contacts 408a and 408b, and contact 420b may be coupled with transducer 408b. Other embodiments may include other configurations of transducers 408a-b or contacts 420a-c.

In embodiments in which method 300 may be used to form a temperature-compensated acoustic wave device, the method 300 may further include depositing a planarizing oxide (e.g., by physical vapor deposition (PVD)) over the transducers, polishing the planarizing oxide (e.g., by chemi-mechanical polishing), and depositing an overcoat oxide (e.g., by PVD) over the polished planarizing oxide. In some embodiments, these operations may be performed prior to forming the contacts on the substrate. The overcoat oxide may be patterned to provide spaces for the contacts. Other embodiments may include a different order of operations or may not include the planarizing oxide or overcoat oxide.

At block 312, the method 300 may include depositing an adhesion layer on the substrate. The adhesion layer may be deposited over the transducers and contacts. The adhesion layer may be deposited by any suitable method, such as PVD. In some embodiments, the adhesion layer may be an oxide, such as Silicon Dioxide (SiO2). The adhesion layer may provide adhesion for the wall layer, as discussed further below. Additionally, or alternatively, the adhesion layer may provide a passivation layer to, for example, resist corrosion of the transducers or contacts.

Figure 4C:
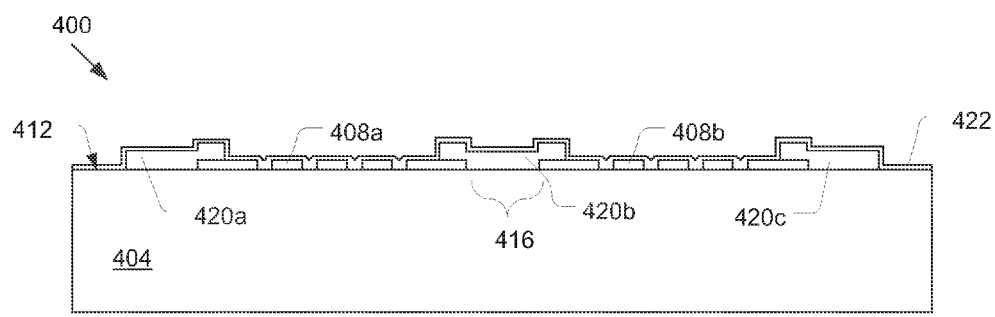

FIG. 4C shows the example acoustic wave device 400 subsequent to depositing an adhesion layer 422 in accordance with some embodiments of block 312.

At block 316, the method 300 may include forming a wall layer having one or more openings around the transducers. The wall layer may include separate openings around different transducers (e.g., openings 128a-b in FIG. 1) or may include an opening that is disposed around a plurality of transducers (e.g., opening 228 in FIG. 2). The wall layer may further include holes above one or more of the contacts. The holes may form portions of respective vias, as discussed further below.

In some embodiments, the wall layer may be formed of a photo-definable dry film epoxy. Additionally, in some embodiments, the photo-definable dry film epoxy may have a glass transition temperature of at least 160 degrees Celsius.

Figure 4D:
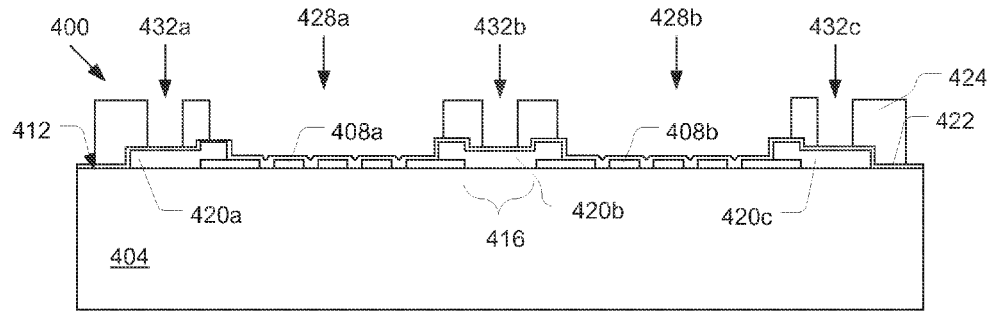

FIG. 4D illustrates the acoustic wave device 400 subsequent to a wall layer 424 being formed in accordance with some embodiments of block 316. Wall layer 424 includes openings 428a-b around the transducers 408a-b and holes 432a-c above contacts 420a-c. In other embodiments, the holes 432a-c may not be formed until after application of the cap 440, discussed further below.

At block 320, the method 300 may include forming a cap on top of the wall layer. The cap may be formed, for example, by laminating a sheet of capping material over the wall layer. The cap may enclose the openings around the transducers to protect the transducers from moisture and/or other elements. In some embodiments, the capping material may be the same material as the wall layer. For example, the capping material may be a photo-definable dry film epoxy. In some embodiments, the photo-definable dry film epoxy may have a glass transition temperature of at least 160 degrees Celsius. The capping material may facilitate structural integrity of the enclosed openings around the transducers.

Figure 4E:
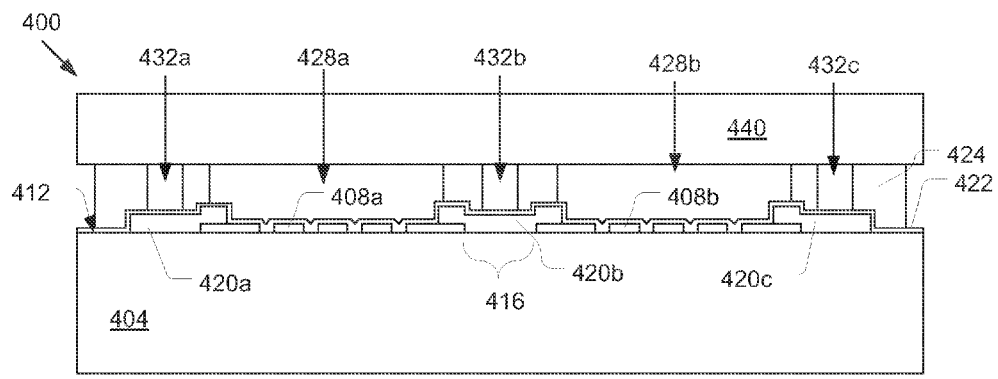

FIG. 4E illustrates the acoustic wave device 400 subsequent to lamination of a cap 440 over the wall layer 424 in accordance with some embodiments of block 320.

At block 324, the method 300 may include patterning the cap to form one or more vias. The vias may be disposed above respective contacts of the acoustic wave device. The vias may be formed, for example, by forming (e.g., photo-defining) holes in the cap above the holes in the wall layer.

Figure 4F:
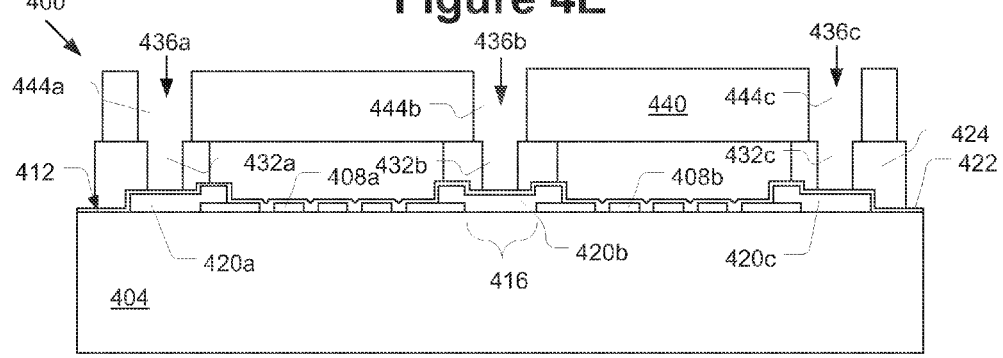

FIG. 4F illustrates the acoustic wave device 400 subsequent to forming vias 436a-c in accordance with some embodiment of block 324. The vias 436a-c may be formed, for example, by forming holes 444a-c in the cap 440 above corresponding holes 432a-c in the wall layer 424. In some embodiments, as shown in FIG. 4F, a width of the holes 444a-c in the cap 440 may be wider than a width of the holes 432a-c in the wall layer 424. This may facilitate alignment of the holes 444a-c with the holes 432a-c to form the vias 436a-c.

At block 328, the method 300 may include removing one or more exposed portions of the adhesion layer from the contacts (e.g., in the vias). The exposed portions of the adhesion layer may be removed, for example, by plasma etch.

Figure 4G:
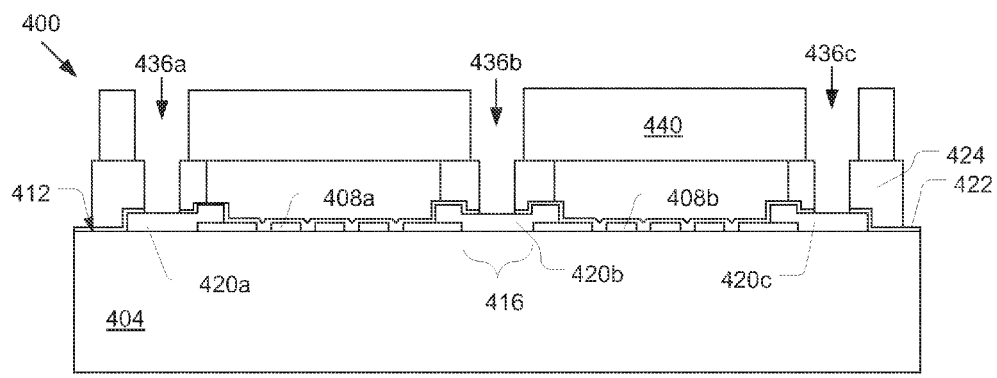

FIG. 4G illustrates the acoustic wave device 400 subsequent to removing portions of the adhesion layer 422 over the contacts 420a-c in the vias 436a-c, in accordance with one embodiment of block 328.

In some embodiments, at block 332, the method 300 may include depositing a seed layer on the substrate. The seed layer may be deposited by any suitable method, such as PVD. The seed layer may be formed of a conductive material, such as a material including Titanium and/or Copper. The seed layer may enhance the electrical connection between the top metal (discussed further below) and the contacts.

Figure 4H:
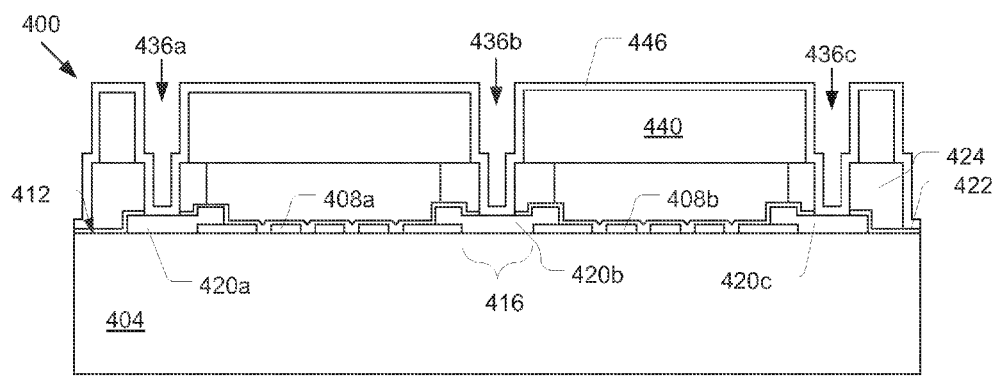

FIG. 4H illustrates the acoustic wave device 400 subsequent to applying a seed layer 446 in accordance with one embodiment of block 332. The seed layer 446 may be disposed in the vias 436a-c on top of contacts 420a-c. In some embodiments, the seed layer 446 may be applied over the entire surface 412 of the substrate 404, as shown. In other embodiments, the seed layer 446 may be selectively deposited in the vias 436a-c and/or portions of the cap 440.

At block 336, the method 300 may further include patterning one or more top metal openings for subsequent deposition of a top metal. The top metal openings may be formed by depositing a photo-resist layer on the surface of the substrate, with the photo-resist layer having openings above the vias. The openings in the photo-resist layer may be wider than the vias in some embodiments (e.g., leaving portions of the cap around the vias exposed).

Figure 4I:
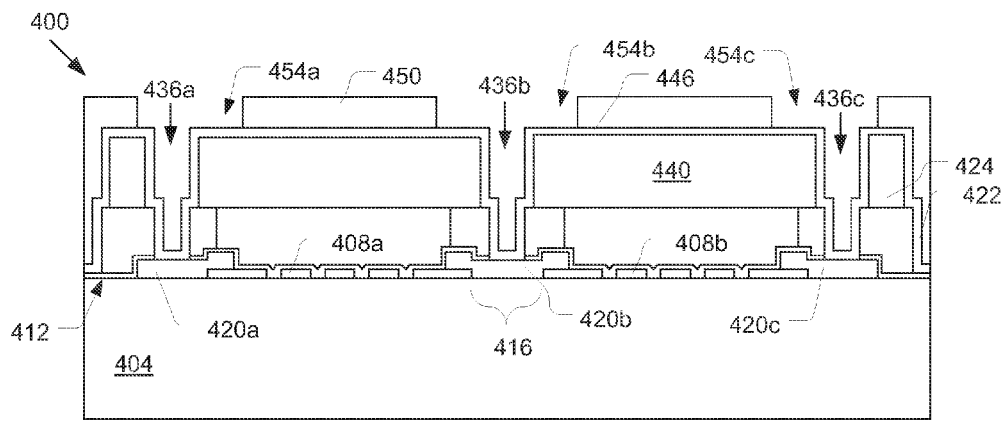

FIG. 4I illustrates the acoustic wave device 400 subsequent to deposition of a photo-resist layer 450 in accordance with one embodiment of block 336. The photo-resist layer 450 may include openings 454a-c above the vias 436a-c.

At block 340, the method 300 may further include depositing a top metal into the vias to form pillars in the vias. The top metal may be deposited, for example, by electroplating. The top metal may include any suitable conductive material, such as Copper. The top metal may also be disposed on the cap in the openings above the vias. Accordingly, the top metal may form pads on the cap that may be defined by the openings in the photo-resist layer. The pillars may provide an electrical connection between the pad and the corresponding contact below the pad.

Figure 4J:
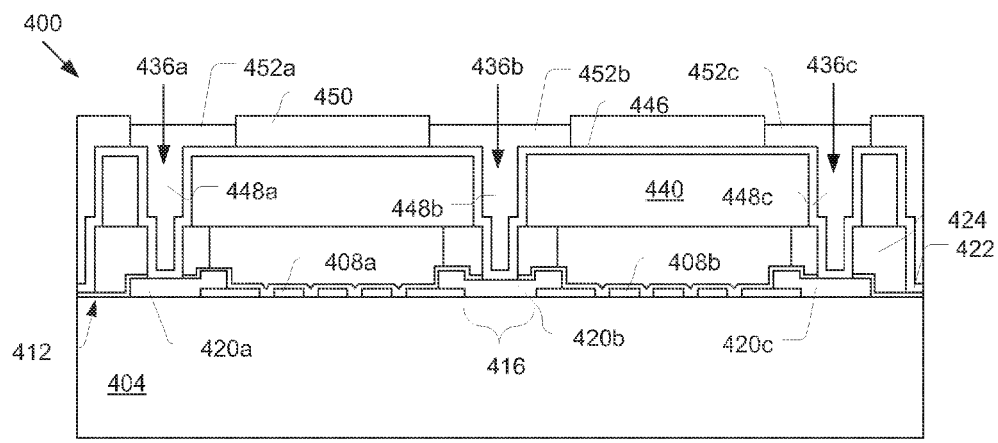

FIG. 4J illustrates the acoustic wave device 400 subsequent to deposition of a top metal layer in the respective vias 436a-c in accordance with one embodiment of block 340. The top metal layer may form pillars 448a-c in the respective vias 436a-c and pads 452a-c on the cap 440. The pillars 448a-c may provide an electrical connection between the pads 452a-c and the respective contacts 420a-c.

At block 344, the method 300 may further include removing the photo-resist layer. The photo-resist layer may be removed after depositing the top metal at block 340. The photo-resist layer may be removed, for example, by solvent clean.

Figure 4K:
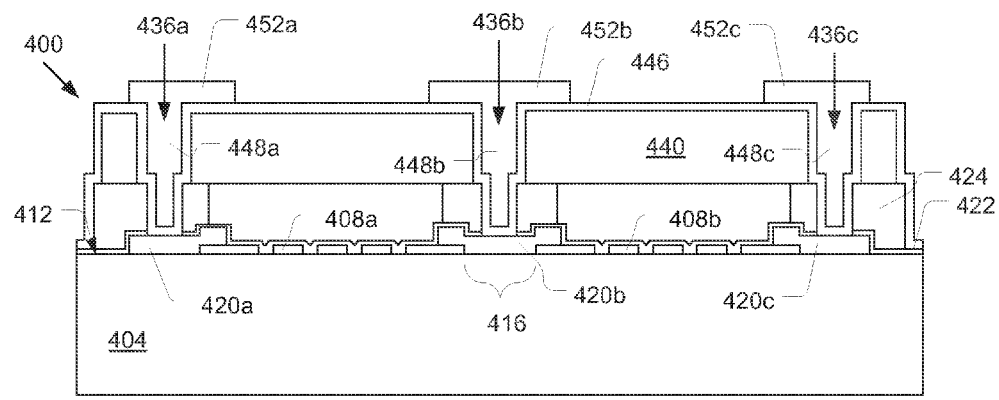

FIG. 4K illustrates the acoustic wave device 400 subsequent to removal of the photo-resist layer 450 according to one embodiment of block 344.

At block 348, the method 300 may further include removing the seed layer from the exposed surface of the acoustic wave device. The seed layer may be removed, for example, by wet cleaning. After removing the seed layer from the exposed surface of the acoustic wave device, the seed layer may be disposed between the top metals and the respective contacts and/or between the top metals and the cap or wall layer.

Figure 4L:
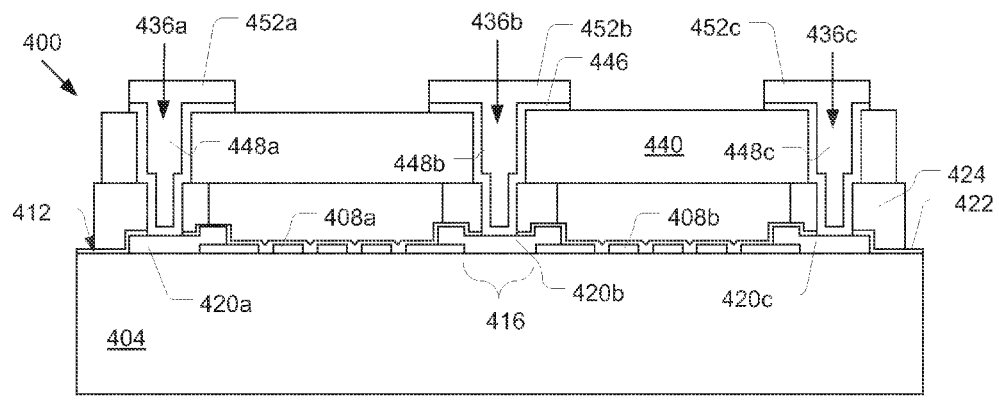

FIG. 4L illustrates the acoustic wave device 400 subsequent to removal of the seed layer 446 from the exposed surface of the acoustic wave device 400 in accordance with one embodiment of block 348. The seed layer 446 may remain disposed under the top metals 448a-c between the top metals 448a-c and the respective contacts 420a-c, wall layer 424, and/or cap 440.

In some embodiments, a protection layer may be deposited over the pads 452a-c. The protection layer may prevent or reduce corrosion of the pads 452a-c. The protection layer may include any suitable material, such as Gold.

In some embodiments, one or more additional layers may be formed on the cap 440. For example, one or more passive devices, such as inductors or capacitors, may be formed on the cap 440. This may allow the one or more passive devices to be integrated with the package of the acoustic wave device 400.

As discussed above, acoustic wave device 400 may be formed on a wafer of substrate. Prior acoustic wave device designs and manufacturing methods required the partially-formed acoustic wave devices to be singulated after deposition of the base metal (to form the transducers) and the under-bump metal (to form the contacts). However, the method 300 may allow a plurality of acoustic wave devices to be formed on a wafer of substrate. The wafer may then be diced to singulate the acoustic wave devices.

In some embodiments, the acoustic wave devices may be provided with a housing after being singulated. The housing may surround the substrate and the stack of layers on the substrate (e.g., the transducers, substrate-level contacts, wall, cap, vias, and pads). The housing may further include housing-level contacts that are electrically coupled with respective pads of the acoustic wave device to facilitate an electrical connection between the housing-level contacts and the substrate-level contacts.

Figure 5:
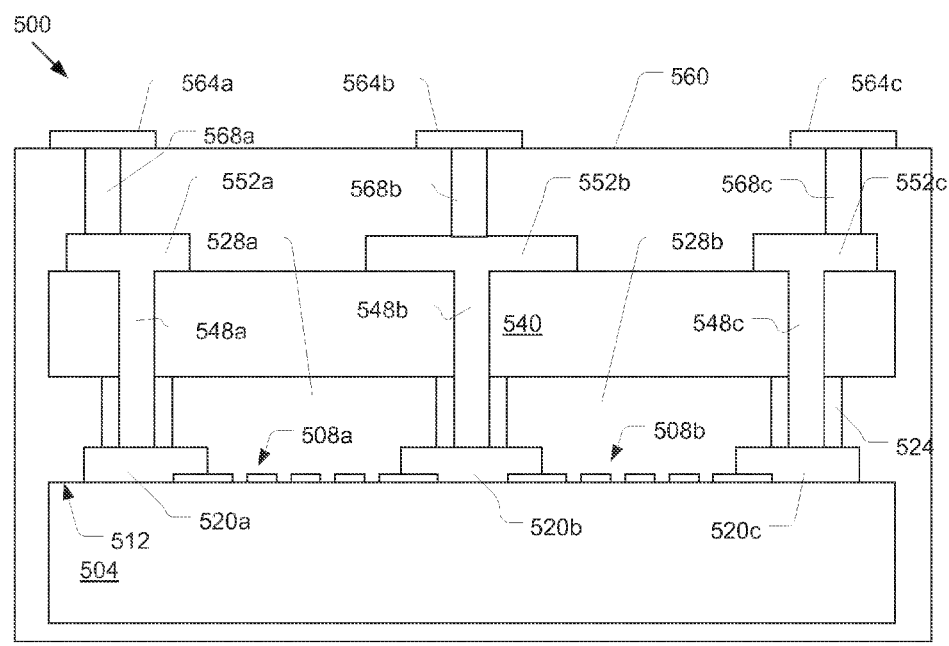
FIG. 5 illustrates an acoustic wave device having a housing in accordance with various embodiments.

FIG. 5 illustrates an acoustic wave device 500 that includes a housing 560 in accordance with various embodiments. The acoustic wave device 500 includes a substrate 504 with a stack of layers disposed on a surface 512 of the substrate 504, including transducers 508a-b, substrate-level contacts 520a-c, wall layer 524, cap 540, pillars 548a-c, and pads 552a-c. The housing 556 may surround the substrate 504 and the layers on the substrate. In some embodiments, the housing 560 may be a laminate housing formed on the substrate over the stack of layers.

In various embodiments, the acoustic wave device 500 may further include housing-level contacts 564a-c. The housing-level contacts 564a-c may be coupled with respective pads 552a-c by connectors 568a-c. Accordingly, the housing-level contacts 564a-c may be electrically coupled with the respective substrate-level contacts 520a-c through respective connectors 568a-c, pads 552a-c, and pillars 536a-c.

In some embodiments, the acoustic wave device 500 may include one or more additional layers between the cap 540 and the housing 560. For example, one or more passive devices (not shown), such as one or more inductors or capacitors, may be formed by one or more layers above the cap 540.

Figure 6:
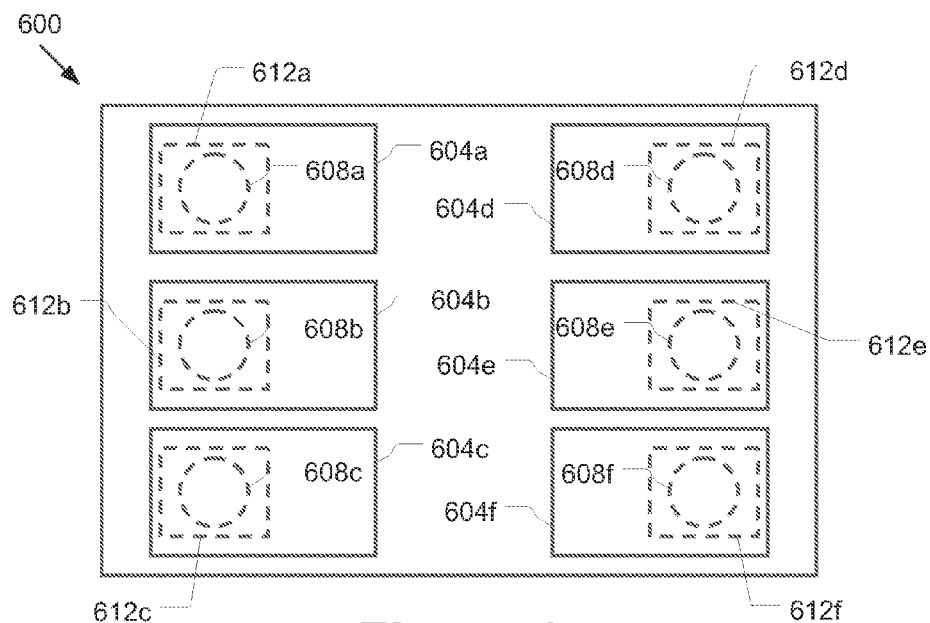
FIG. 6 schematically illustrates a top cross-section view of an acoustic wave device having pillars aligned with connectors, in accordance with various embodiments.

FIG. 6 illustrates a top cross-sectional view of an acoustic wave device 600 in accordance with various embodiments. The acoustic wave device 600 includes pads 604a-f, with pillars 608a-f extending in a first direction (e.g., into the page) to substrate-level contacts on a substrate (e.g., substrate-level contacts 520a-c on substrate 504 shown in FIG. 5) and connectors 612a-f extending in a second direction (e.g., out of the page), opposite the first direction, to housing-level contacts on a housing (e.g., housing-level contacts 564a-c on housing 560 shown in FIG. 5).

The pads 604a-f may have any suitable configuration for the acoustic wave device 600. For example, the pads 604a and 604d may be positive and negative input pads, respectively, to receive an input signal for the acoustic wave device 600; the pads 604b and 604e may be ground pads to receive a ground potential; and/or the pads 604c and 604f may be positive and negative output pads, respectively, to pass an output signal for the acoustic wave device 600. Other embodiments may include other configurations of the pads 604a-f.

As shown in FIG. 6, in some embodiments, the connectors 612a-f may be aligned with the respective pillars 608a-f in the cross-sectional plane of the pad 604a-f.

Figure 7:
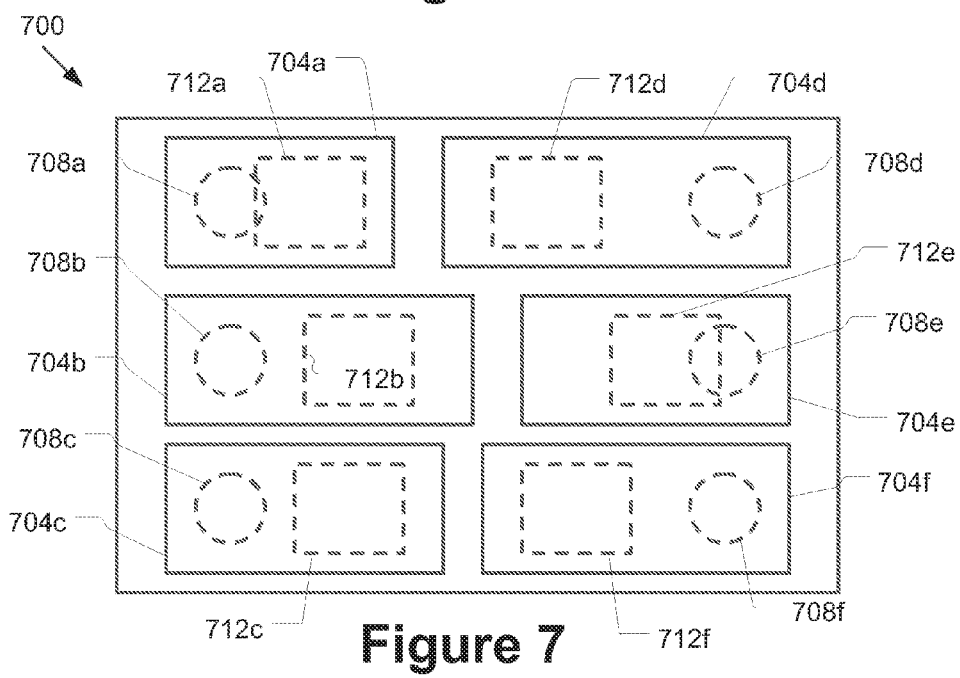
FIG. 7 schematically illustrates a top cross-section view of an acoustic wave device having pillars offset from connectors, in accordance with various embodiments.

FIG. 7 illustrates a top cross-sectional view of another acoustic wave device 700 in accordance with various embodiments. The acoustic wave device 700 may include pads 704a-f, pillars 708a-f, and connectors 712a-f. As shown in FIG. 7, one or more of the connectors 712a-f may be offset from the corresponding pillar 708a-f. The one or more offset connectors 712a-f may be partially offset from the corresponding pillar 708a-f (e.g., connectors 708a and 708e, with a portion of the connector overlapping with the pillar, a portion of the connector not overlapping with the pillar, and a portion of the pillar not overlapping with the connector) or completely offset (e.g., connectors 708b-d and 708f, with the entire connector not overlapping with the pillar).

The pads 704 may electrically couple the offset connectors 712a-f to the corresponding pillars 708a-f. Accordingly, the acoustic wave device 700 may facilitate flexible arrangement of the housing-level contacts. For example, the arrangement of the housing-level contacts on the housing may be substantially the same for different acoustic wave devices which have different arrangements of substrate-level contacts on the substrate.

FIG. 8 illustrates a top cross-sectional view of an acoustic wave device 800 in accordance with various embodiments. The acoustic wave device 800 may include pads 804a-e, pillars 808a-f, and connectors 812a-e. The acoustic wave device 800 may include a pad 804b that is coupled with a plurality of pillars 808b and 808e and a single connector 812b. In some embodiments, the pad 804b may form a ground plane to connect the connector 812b to both of the pillars 808b and 808e. This may allow a single housing-level contact to provide a ground potential to a plurality of substrate-level contacts. Accordingly, the acoustic wave device 800 may not require a ground-to-ground connection in the housing.

FIG. 9 illustrates a top cross-sectional view of an acoustic wave device 900 in accordance with various embodiments. The acoustic wave device 900 may include pads 904a-f, pillars 908a-f, and connectors 912a-g. The acoustic wave device 900 may include a pad 904b that is coupled with a plurality of connectors 912b and 912g. The plurality of connectors 912b and 912g may provide heat dissipation for the acoustic wave device. In some embodiments, the connectors 912b and 912g may be coupled to a same housing-level contact.

In some embodiments, the acoustic wave device 900 may additionally or alternatively include a pad that is coupled with a plurality of pillars to provide heat dissipation. The plurality of pillars may be coupled to a same substrate-level contact.

Figure 10:
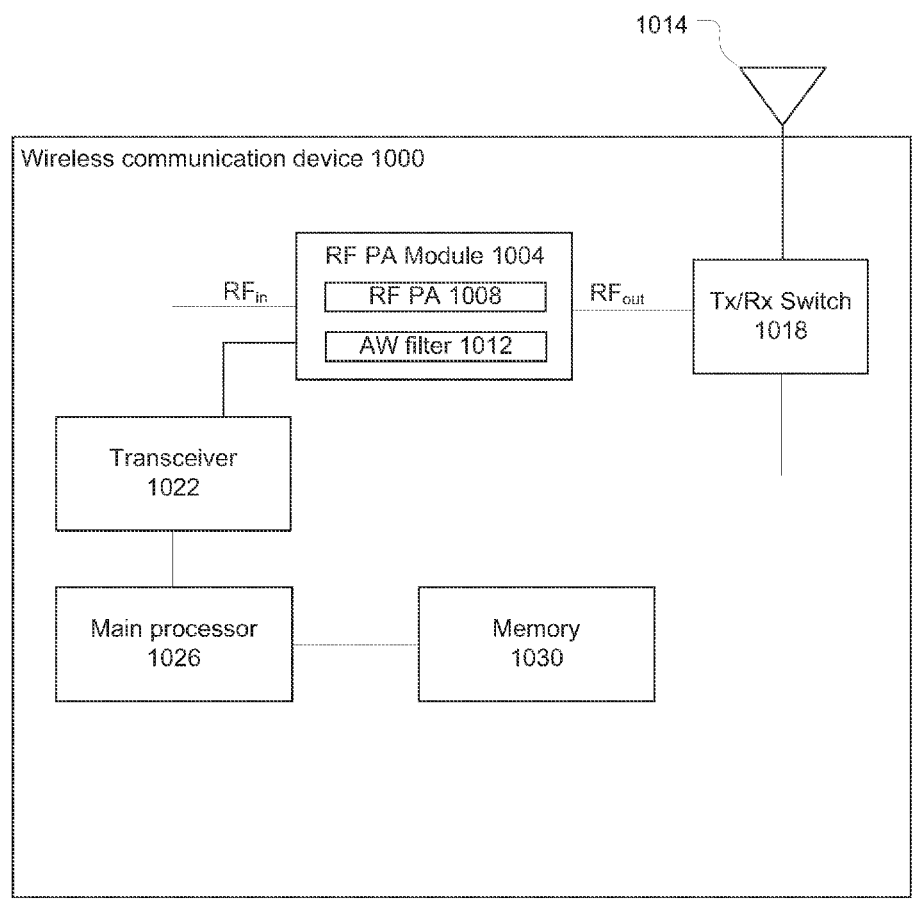
FIG. 10 schematically illustrates an example system including an acoustic wave device, according to various embodiments.

Embodiments of an acoustic wave device (e.g., the acoustic wave device 100, 200, 400, 500, 600, 700, 800, and/or 900) described herein, and apparatuses including such acoustic wave device may be incorporated into various other apparatuses and systems. A block diagram of an exemplary wireless communication device 1000 is illustrated in FIG. 10 in accordance with some embodiments. Wireless communication device 1000 may have an RF power amplifier (PA) module 1004 including one or more RF PAs 1008. RF PA module 1004 may further include one or more acoustic wave filters 1012 coupled with one or more of the RF PAs 1008. The acoustic wave filters 1012 may be similar to and/or include acoustic wave devices 100, 200, 400, 500, 600, 700, 800, and/or 900. Additionally, or alternatively, the acoustic wave filters 1012 may be formed by method 300.

In addition to the RF PA module 1004, the wireless communication device 1000 may have an antenna structure 1014, a Tx/Rx switch 1018, a transceiver 1022, a main processor 1026, and a memory 1030 coupled with each other at least as shown. While the wireless communication device 1000 is shown with transmitting and receiving capabilities, other embodiments may include devices with only transmitting or only receiving capabilities. While acoustic wave filters 1012 are shown as included in RF PA module 1004, in other embodiments, acoustic wave filters 1012 may be included in other components of the wireless communication device 1000, such as Tx/Rx switch 1018 and/or transceiver 1022, in addition to or instead of RF PA module 1004.

In various embodiments, the wireless communication device 1000 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 1026 may execute a basic operating system program, stored in the memory 1030, in order to control the overall operation of the wireless communication device 1000. For example, the main processor 1026 may control the reception of signals and the transmission of signals by transceiver 1022. The main processor 1026 may be capable of executing other processes and programs resident in the memory 1030 and may move data into or out of memory 1030, as desired by an executing process.

The transceiver 1022 may receive outgoing data (e.g., voice data, web data, e-mail, signaling data, etc.) from the main processor 1026, may generate the $RF_{in}$ signal(s) to represent the outgoing data, and provide the $RF_{in}$ signal(s) to the RF PA module 1004. The transceiver 1022 may also control the RF PA module 1004 to operate in selected bands and in either full-power or backoff-power modes. In some embodiments, the transceiver 1022 may generate the $RF_{in}$ signal(s) using OFDM modulation.

The RF PA module 1004 may amplify the $RF_{in}$ signal(s) to provide $RF_{out}$ signal(s) as described herein. The $RF_{out}$ signal(s) may be forwarded to the Tx/Rx switch 1018 and then to the antenna structure 1014 for an over-the-air (OTA) transmission. In some embodiments, Tx/Rx switch 1018 may include a duplexer. In a similar manner, the transceiver 1022 may receive an incoming OTA signal from the antenna structure 1014 through the Tx/Rx switch 1018. The transceiver 1022 may process and send the incoming signal to the main processor 1026 for further processing.

In various embodiments, the antenna structure 1014 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 1000 is given by way of example and that, for simplicity and clarity, only so much of the construction and operation of the wireless communication device 1000 as is necessary for an understanding of the embodiments is shown and described. Various embodiments contemplate any suitable component or combination of components performing any suitable tasks in association with wireless communication device 1000, according to particular needs. Moreover, it is understood that the wireless communication device 1000 should not be construed to limit the types of devices in which embodiments may be implemented.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An acoustic wave device comprising:
 a piezoelectric substrate having a first surface;
 an acoustic wave transducer disposed on the first surface;
 a contact coupled with the acoustic wave transducer;
 a wall layer on the first surface disposed around the transducer and defining an opening over the transducer;
 a cap on the wall layer enclosing the opening over the transducer;
 a via through the cap and the wall layer above the contact;
 a pad on the cap above the via;
 a pillar disposed in the via to provide an electrical connection between the pad and the contact; and
 a seed layer of conductive material disposed between the pillar and the contact.

2. The device of claim 1, wherein the cap is formed of a photo-definable dry film material with a glass transition temperature of at least 160 degrees Celsius.

3. The device of claim 1, further comprising an adhesion layer disposed between the wall layer and the substrate to adhere the wall layer to the substrate, wherein the adhesion layer is also disposed over the transducer to provide a passivation layer.

4. The device of claim 1, wherein the contact is a substrate-level contact, and wherein the device further includes:
 a laminate housing having a housing-level contact; and
 a connector to couple the pad with the housing-level contact.

5. The device of claim 4, wherein the connector is offset from the pillar in a cross-sectional plane of the pad.

6. The device of claim 4, further comprising two or more connectors coupled with the pad.

7. The device of claim 1, further comprising two or more pillars coupling the pad to the contact.

8. The device of claim 1, wherein the acoustic wave transducer is an input transducer, the contact is a first contact, the pad is a first pad, and the pillar is a first pillar, and wherein the device further includes:

an output transducer disposed on the first surface of the substrate;
a second contact coupled with the output transducer;
a second pad on the cap above the second contact; and
a second pillar electrically coupling the second pad to the second contact.

9. The device of claim 1, wherein the device is a radio frequency (RF) filter.

* * * * *